US005629943A

United States Patent [19]

McClure

[11] Patent Number: 5,629,943
[45] Date of Patent: May 13, 1997

[54] INTEGRATED CIRCUIT MEMORY WITH DOUBLE BITLINE LOW SPECIAL TEST MODE CONTROL FROM OUTPUT ENABLE

[75] Inventor: David C. McClure, Denton, Tex.

[73] Assignee: SGS-Thomson Microelectronics, Inc., Carrollton, Tex.

[21] Appl. No.: 251,565

[22] Filed: May 31, 1994

Related U.S. Application Data

[63] Continuation-in-part of Ser. No. 173,197, Dec. 22, 1993, Pat. No. 5,577,051, and Ser. No. 172,854, Dec. 22, 1993, abandoned.

[51] Int. Cl.[6] ............................................. G11C 29/00
[52] U.S. Cl. ................................... 371/21.1; 365/201
[58] Field of Search ................................ 371/21.1, 15.1, 371/10.1, 21.4, 21.3; 365/201, 154, 185, 49; 395/575, 425, 725

[56] References Cited

U.S. PATENT DOCUMENTS

| | | | |
|---|---|---|---|
| 4,460,978 | 7/1984 | Jiang et al. | 365/154 |
| 5,051,948 | 9/1991 | Watabe et al. | 365/49 |
| 5,072,137 | 12/1991 | Slemmer | 307/465 |
| 5,072,138 | 12/1991 | Slemmer et al. | 307/465 |
| 5,134,586 | 7/1992 | Steele | 365/201 |
| 5,134,587 | 7/1992 | Steele | 365/201 |
| 5,255,230 | 10/1993 | Chan et al. | 365/201 |
| 5,289,475 | 2/1994 | Slemmer | 371/21.1 |
| 5,329,175 | 7/1994 | Peterson | 307/443 |
| 5,347,843 | 9/1994 | Torimaru | 365/49 |

*Primary Examiner*—Robert W. Beausoliel, Jr.
*Assistant Examiner*—Phung My Chung
*Attorney, Agent, or Firm*—Theodore E. Galanthay; Lisa K. Jorgenson; Renee M. Larson

[57] ABSTRACT

Circuitry for performing a special test of an integrated memory circuit is disclosed, where the special test requires driving of both bitlines associated with a column of memory cells to a selected logic level, such as ground. The special test is performed in a mode different from normal operation of the memory, and is useful in performing a write disturb test, and in performing stress tests of memory elements such as pass transistors in static random access memory cells. The special test is performed by generating an internal signal selecting the placement of both bitlines in one or more bitline pairs to the selected logic level. Circuitry is also disclosed which uses the output enable terminal, in the special test mode, for controlling the driving of both bitlines to the selected logic level, as the output enable terminal otherwise has no required function in this special test mode.

22 Claims, 4 Drawing Sheets

INTEGRATED CIRCUIT MEMORY WITH DOUBLE BITLINE LOW SPECIAL TEST MODE CONTROL FROM OUTPUT ENABLE

This application is a continuation-in-part of my application Ser. No. 08/173,197, U.S. Pat. No. 5,577,051, and of my application Ser. No. 08/172,854, abandoned, both of said applications filed Dec. 22 1993, assigned to SGS-Thomson Microelectronics, Inc. and incorporated herein by this reference.

The present invention is in the field of testing static integrated memory circuits, and is more specifically to an improved method and structure for performing special tests on static memories.

BACKGROUND OF THE INVENTION

Writing to a memory cell or cells of static memories, such as static random access memories (SRAMs), multiple port memories, and First In First Out (FIFO) Memories, can sometimes affect adjacent memory cells on the same column that share a bitline. These memory cells should not be affected if their wordlines are off; however, leakage from a memory cell node to a bitline may be enough to overcome the pull-up resistance of the memory cell, causing the data of the memory cell to be corrupted. This problem is exacerbated by a long write cycle, because there is greater opportunity for such leakage to occur. Therefore, memory cell node to bitline leakage and subsequent corruption of memory cells is often a concern during long write cycle operation of a static memory.

The long write cycle problem occurs when writing to a selected memory cell in a column inadvertently affects the contents of non-selected memory cells in the same column, whose wordlines are off. If a memory cell has leakage from one of its storage nodes through the pass transistor to the bitline at a differential voltage from the storage node, an erroneous change of state can occur if the duration of the write cycle draws enough charge from the memory cell node to switch the cell state.

In order to screen memory devices that are sensitive to leakage during long write cycles, long write cycle testing is conducted in the manufacturing testing process by first writing a test data pattern to selected memory cells of a static memory. A long write cycle is then performed, typically on the order of microseconds, providing enough time for the leakage to cause a change of state in memory cells that have leaky pass transistors. This screening has been made more efficient by including special test modes in memory devices (in contrast to normal operating modes), in which the long write cycle is accomplished by turning off all wordlines of the memory, and pulling down either the true or complement bitline throughout the entire memory array, or a subset of the memory array, "disturbing" the memory cells. The memory cells are then read following the disturb condition to check for errors in the states of individual memory cells.

However, two issues must be considered before adopting such a special test mode in a memory design. First, the data states of both the memory cell under test and its adjacent memory cells, on all sides, can be critical in determining whether the memory cell has a propensity to be disturbed during long write testing. For instance, memory cells tend to fail on either the bitline true or the bitline complement side of the cell, because only one side of a memory cell usually leaks, in which case the likelihood of a memory cell to fail will depends upon the data state stored therein. Additionally, adjacent memory cells frequently share common connections to power supplies. Therefore, the stored data state of the memory cell under test, the stored data states of adjacent memory cells, and the shared common power supply connections of neighboring memory cells are all factors which can greatly affect the sensitivity of a memory cell to long write cycle disturbs.

Second, in order to pull down multiple bitlines of a memory cell, it is necessary to first turn off the bitlines in order to decrease power consumption. Incorporating the necessary bitline control to turn off appropriate bitline loads and pull bitlines to ground during the disturb for the various test data patterns to which a static memory is typically subjected necessarily introduces complicated circuitry to perform the requisite independent bitline load control function. Such complicated circuitry takes up valuable space within the static memory. A possible solution to these competing interests is to pull low the bitline true for all memory cells being tested while leaving the bitline complement high for all memory cells being tested, and vice versa for a second pass; alternatively, another simple pattern may be used. However, such schemes have limited practical use, because they do not address the great number of different test data patterns typically used to test static memories.

It is therefore an object of the present invention to provide a long write testing method which effectively and efficiently tests memory cells of a static memory for leakage problems using minimal control circuitry.

It is a further object of the present invention to provide a memory structure which provides for effective and efficient long write testing of static memory cells so that memory cells which have leakage problems may be identified using minimal control circuitry.

It is a further object of the present invention to provide a memory that can effect such long write testing by pulling both bitlines in a differential bitline architecture to a reference voltage.

It is a further object of the present invention to provide a method and circuit for controlling the pulling of bitlines to the reference voltage without requiring an additional external terminal.

Other objects and advantages of the present invention will be apparent to those of ordinary skill in the art having reference to the following specification together with its drawings.

SUMMARY OF THE INVENTION

The present invention may be implemented into an integrated memory circuit so that, after a test data pattern has been written to selected static memory cells, the wordlines of the memory cells are turned off and the bitline true and bitline complement of the memory cells are simultaneously pulled to a predetermined logic level for the duration of a long write cycle so that the memory cells are disturbed. After the long write disturb, the contents of the memory cells are read to determine which, if any, memory cells contain corrupted data and therefore have bitline to memory cell leakage problems.

According to another aspect of the invention, a terminal that has another function in normal operation is used, in a special test mode such as a long write disturb test or a stress test, to select pulling both the bitline true and bitline complement to the predetermined logic level for this special test; preferably, the output enable terminal is used for selecting the driving of both bitlines in such a test.

DETAILED DESCRIPTION OF THE PREFERRED EMBODIMENTS

The present invention provides an effective and efficient way of performing long write testing on static memories, such as SRAMS, multiple port memories, and First In First Out (FIFO) memories, using simplified memory cell bitline control. Long write testing is a special test mode which may be entered a variety of ways, such as subjecting a pin of the static memory to an over voltage condition or utilizing a clocking sequence. After writing a test data pattern into selected memory cells, the wordlines of all memory cells to be tested are turned off, and bitlines true and bitlines complement are pulled to a logic low level for the duration of the long write test. This allows any test data pattern to be stored in memory cells and then disturbed, all in one pass. The test data pattern may be based on the worst case disturb scenario, which is dependent on a number of factors, including the layout of the memory array, the sharing of power supplies between memory cells, and the topology that results from the orientation of memory cells relative to adjacent memory cells, so that any leakage problem present is maximized and thus identifiable.

Figure 1:
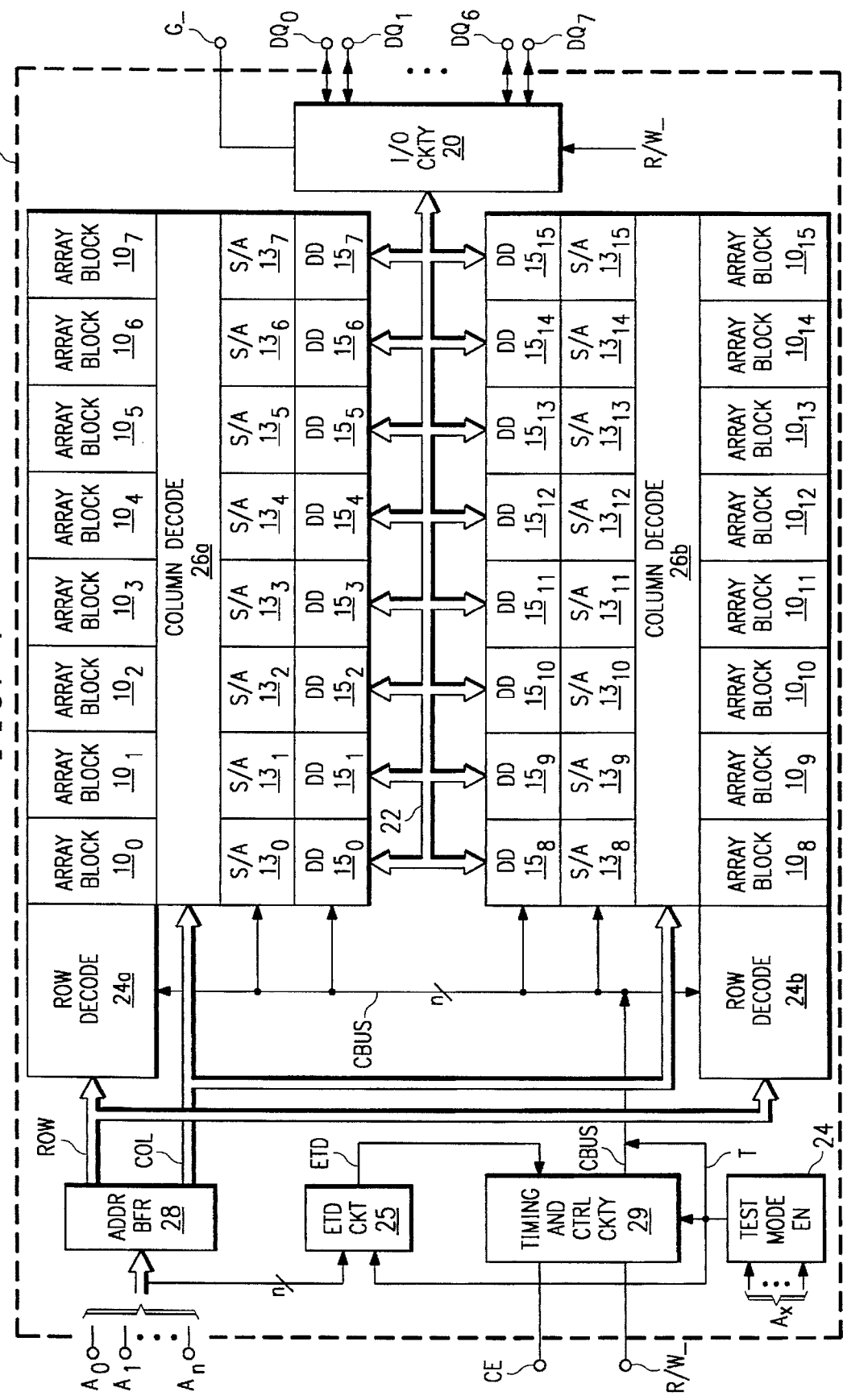
FIG. 1 is an electrical diagram, in block form, of an integrated circuit memory according to the preferred embodiment of the invention.

Referring now to FIG. 1, an example of an integrated circuit into which the preferred embodiment of the invention is implemented will be described. In this example, memory 1 is a static random access memory (SRAM) of otherwise conventional architecture, having its memory cells in multiple blocks 10 which are shown, in FIG. 1, according to an example of their physical location in such a memory. It is contemplated that integrated circuits of other types may also benefit from the present invention, such integrated circuits including microprocessors, logic devices, and other types of memories including read-only memories, FIFOs, and the like.

As is conventional, memory cells in memory 1 are arranged in rows and columns. It should be noted that the designation of rows and columns in memory 1 use the term row to refer to the array direction in which a plurality of memory cells are selected by way of a wordline. In conventional memories, each of the memory cells in the selected row are generally coupled to one or a complementary pair of bitlines. The term column is used in this description to refer to the array direction in which one or more of the memory cells in the selected row are selected for read or write access. In conventional memories, this is generally accomplished by coupling one of the bitlines to a sense amplifier/write circuit, or to an internal data bus. It is contemplated that the use herein of the terms rows and columns is consistent with the general understanding in the art.

Address terminals $A_0$ through $A_n$ receive an address signal according to which one or more of the memory cells in memory 1 are to selected for access. In the conventional manner, address terminals $A_0$ through $A_n$ are connected to address buffers 28, which buffer the received address signal and communicate a portion of the address signal to row decoders 24a, 24b on bus ROW, and communicate the remainder to column decoders 26a, 26b on bus COL. Row decoders 24a, 24b select a row of memory cells by enabling the selected word line, in the conventional manner, and are thus preferably located along a side of the memory array blocks 10. Column decoders 26a, 26b, in this example, select eight memory cells in the selected row to be sensed by a sense amplifier 13 according to the column portion of the address.

In memory 1 according to this example, the memory cells are grouped into sixteen array blocks $10_0$ through $10_{15}$; of course, the number of array blocks 10 may vary for different implementations. This partitioning into array blocks 10 is particularly beneficial in low power memories, such as may be used in portable computers, as only the array block 10 in which the selected memory cells are located need be enabled during a cycle. Selection of the block may be done according to one of the row address bits (indicating upper or lower half) and to four of the column address bits (indicating one of sixteen array blocks 10 to be selected). Further reduction in the active power may be obtained by the implementation of latched row line repeaters between array blocks 10, as described in U.S. Pat. No. 5,121,358, issued Jun. 9, 1992, assigned to SGS-Thomson Microelectronics, Inc., and incorporated herein by this reference.

Alternatively, selection of a row within one of array blocks 10 may be made by way of a global wordline generated by row decoders 24a, 24b extending across those array blocks 10 for which it is operable. Pass gates by which memory cells within each of array blocks 10 are connected to their bitlines are, in this alternative arrangement, controlled by local wordlines which extend only within each array block 10 for each row portion therein. In this arrangement, pass transistors connected between each global wordline are enabled according to a block portion of the column address, so that only the local wordline associated with the array block 10 selected by the column address is enabled, thus reducing the active power dissipation of each memory cycle. An example of such an arrangement is described in Sakurai, et al., "A Low Power 46 ns 256 kbit CMOS Static RAM with Dynamic Double Word Line", *J. Solid State Circ.*, Vol. SC-19, No. 5 (IEEE, October 1984), pp. 578–585.

Memory 1, as in the case of most modern SRAMs and DRAMs, includes some amount of dynamic operation, such as precharging and equilibration of certain nodes (e.g., bitlines) at particular points in the memory cycle. Initiation of the cycle in SRAM 1 occurs by way of edge transition detection, performed by edge transition detection (ETD) circuit 25. ETD circuit 25 is connected to each of the address inputs $A_0$ through $A_n$, preferably prior to address buffers 28 (as shown), and generates a pulse on line ETD responsive to detecting a transition at any one or more of address inputs $A_0$ through $A_n$, such a pulse useful in controlling the internal operation of memory 1 in the conventional manner.

Other internal operational functions are controlled by timing and control circuitry 29, which receives the signal on line ETD from ETD circuit 25, and which also receives certain external control signals such as the chip enable signal at terminal CE, and the read/write select signal at terminal R/W__. Timing and control circuitry 29 generates various control signals based on these inputs, for control of the various functions within memory 1 in the conventional manner. As shown in FIG. 1, control bus CBUS is connected to sense amplifiers 13 and data drivers 15; other functions are similarly controlled by timing and control circuitry 29 in the conventional manner, with their connections not shown in FIG. 1 for purposes of clarity.

Memory 1 in this example is of the byte-wide type, and as such it has eight input/output terminals $DQ_0$ through $DQ_7$ at which output data is presented during a read operation, and at which input data is received during a write operation, as indicated by the signal presented to terminal R/W__ (a high logic level thereat indicating a read operation, and a low logic level selecting a write operation). Input/output circuitry 20 is connected between data bus 22 and terminals DQ, and includes input and output buffers of the conventional type, and as described hereinbelow. Memory 1 also includes an output enable terminal G__, coupled to input/output circuitry 20, for enabling and disabling output buffers in input/output circuitry 20 during read operations; as indicated by the nomenclature, a low logic level at terminal G__ enables the presentation of data at data terminals DQ in a read cycle, while a high logic level thereat maintains data terminals DQ in a high impedance state. Specific implementations of circuitry implementing such control of output buffers responsive to an output enable signal presented at an external terminal are well known in the art. An example of an output buffer controlled according to an output enable signal (or, conversely, an output disable signal) is described in copending application Ser. No. 08/185,650, filed Jan. 26, 1994 (a continuation of application Ser. No. 07/809,387, filed Dec. 17, 1991, now abandoned), assigned to SGS-Thomson Microelectronics, Inc. and incorporated herein by this reference. As will be described in further detail hereinbelow, output enable terminal G__ is also useful for controlling one of the special test modes according to the preferred embodiment of the invention.

Each of array blocks $10_0$ through $10_{15}$ is associated with a corresponding group of sense amplifiers $13_0$ through $13_{15}$, as shown in FIG. 1. In this example, eight individual sense amplifiers 13 are included within each group of sense amplifiers $13_0$ through $13_{15}$, one sense amplifier 13 for each of the eight bits to be communicated on internal data bus 22 from the selected one of array blocks $10_0$ through $10_{15}$. Groups of data drivers $15_0$ through $15_{15}$ are each associated with a corresponding group of sense amplifiers $13_0$ through $13_{15}$ for receiving the data signal therefrom and for driving internal data bus 22 therewith; individual data drivers 15 are associated with individual sense amplifiers 13 in each group, one data driver 15 for driving each line in data bus 22.

In this example, the memory array is also divided into halves, with array blocks $10_0$ through $10_7$ in one array half and array blocks $10_8$ through $10_{15}$ in the other half. Internal data bus 22 runs the length of the array halves, and is located therebetween as shown in FIG. 1. Data bus 22 includes eight data conductors, each associated with an input/output terminal $DQ_0$ through $DQ_7$ and coupled thereto via input/output circuitry 20. Each individual data conductor is connected to a corresponding data driver 15 in each of the sixteen data driver groups $15_0$ through $15_{15}$ of the sixteen array blocks $10_0$ through $10_{15}$. For a read/write memory such as memory 1, a separate input data bus can be used to communicate input data to be written to the selected memory cells, in the conventional manner. Alternatively, the input data may also be communicated along data bus 22, as is conventional for some memory designs.

In this example, data bus 22 also includes eight dummy data conductors, each of which are also connected to a corresponding data driver 15 in each of the sixteen data driver groups $15_0$ through $15_{15}$ of the sixteen array blocks $10_0$ through $10_{15}$, for precharging data bus 22 by way of charge sharing. Each of these dummy data conductors preferably physically resembles one of data conductors, preferably having substantially the same length and cross-sectional area, and being formed of the same material. Additional detail regarding the construction and operation of this example of data bus 22, including the dummy data conductors, is provided in U.S. Pat. No. 5,295,104, issued Mar. 15, 1994, assigned to SGS-Thomson Microelectronics, Inc., and incorporated herein by this reference.

Memory 1 according to this embodiment of the invention also includes the ability to enter special test modes, in which both the internal operation of memory 1 and also the functions of external terminals of memory 1 are different from that during normal operation as a memory. As shown in FIG. 1, test mode enable circuitry 24 is provided which receives inputs from certain terminals of memory 1 that are useful in normal operation, for example one or more address terminals (shown in FIG. 1 as $A_x$). An example of test mode enable circuitry 24 is described in the above-reference U.S. Pat. No. 5,072,138; of course, other conventional implementations for test mode enable circuitry 24, and techniques of operating the same, may alternatively be used. In addition, test mode enable circuitry 24 may receive an external test mode enable signal to enter test mode; use of such an external terminal is generally limited to electrical testing of memory 1 in wafer form, as the number of terminals in wafer form is not as critical as for packaged devices. In response to these inputs, test mode enable circuitry 24 produces a test mode enable signal on line T, which is communicated throughout memory 1 to select and control the desired special test mode; as such, line T is shown as becoming part of control bus CBUS. It is contemplated, of course, that multiple special test modes may be enabled or selected for a given memory, and as such line T may instead correspond to multiple lines, carrying either a binary value or a decoded value that indicates the selected special test mode under which memory 1 is to operate.

In addition, according to this embodiment of the invention, line T is also coupled to ETD circuit 25 to control the generation of the ETD signal on line ETD during test mode. This prevents the unintended initiation of memory cycles during certain special tests, particularly those in which the bitlines are driven with a high differential voltages, as operations such as equilibration during such tests could result in catastrophic failure.

It is contemplated that the above-referenced general description of memory 1 will be suitable for explanation to one of ordinary skill in the art of the construction, operation and benefits of the present invention as described herein.

Figure 2:
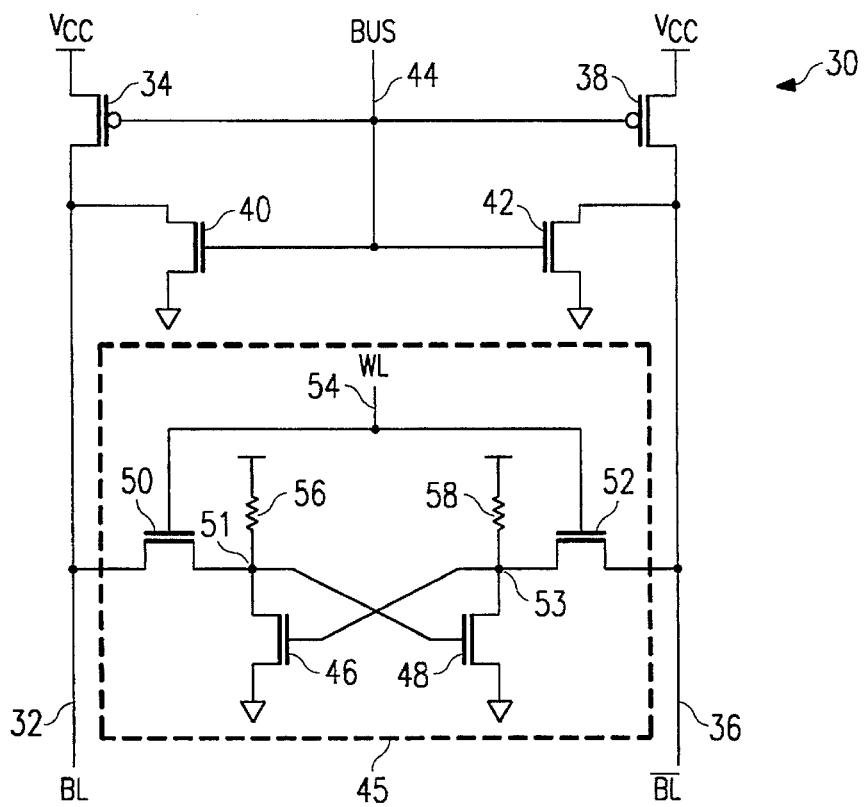
FIG. 2 is an electrical diagram, in schematic form, of a memory structure according to a first preferred embodiment of the present invention.

Referring to FIG. 2, memory structure 30 according to a first preferred embodiment of the present invention, and having differential bitlines, will be described. Bitline true 32 is connected to the drain of p-channel bitline true load transistor 34, and bitline complement 36 is connected to the drain of p-channel bitline complement load transistor 38. The gates of each of p-channel bitline true load transistor 34 and p-channel bitline complement load transistor 38 are controlled by bus 44, and the sources of load transistors 34, 38 are both biased to the $V_{cc}$ power supply; one skilled in the art will recognize that n-channel transistors could alternatively be used as load devices. Additionally, memory structure 30 has n-channel pull-down transistor 40 having its drain connected to bitline true 32 and n-channel pull-down transistor 42 having its drain connected to bitline complement 36. Bus 44 is connected to the gates of pull-down transistor 40 and pull-down transistor 42, and the sources of pull-down transistors 40, 42 are biased to a reference voltage, such as ground. When bus 44 is pulled to a logic high level during the long write test, p-channel bitline true load 34 and p-channel bitline complement load 38 are turned off, and n-channel pull-down transistors 40 and 42 turn on so that bitline true 32 and bitline complement 36 are simultaneously pulled to a logic low level, which is typically ground as shown in FIG. 2.

Memory cell 45 of memory structure 30 is of the polycrystalline silicon resistor load type well known in the art (also referred to as the 4-transistor, 2-resistor type) and resides between bitline true 32 and bitline complement 36. Polysilicon resistor load memory cell 45 has n-channel pass transistor 50 having a source/drain connected on one side to bitline true 32, and n-channel pass transistor 52 having a source/drain connected on one side to bitline complement 36. The gates of pass transistors 50 and 52 are connected to and controlled by wordline signal 54. The drains of n-channel cell transistors 46 and 48 are connected to second side of the source/drain paths of pass transistors 50 and 52, respectively. The drain of cell transistor 46 is also connected to the gate of cell transistor 48, and the drain of cell transistor 48 is connected to the gate of cell transistor 46, in conventional cross-coupled fashion; the drains of cell transistors 46, 48 are biased to the memory cell supply voltage $V_{cc}$ through polycrystalline silicon resistors 56 and 58, respectively, and their sources are biased to ground. Memory cell node 51 is defined as the electrical connection of the drain of cell transistor 46 and the gate of cell transistor 48 and, conversely, memory cell node 53 is defined as the electrical connection of the drain of cell transistor 48 and the gate of cell transistor 46. While the 4-T, 2-R memory cell is shown in FIG. 2, other types of memory cells, such as a 6 transistor memory cell, may also be used in conjunction with the present invention.

Memory structure 30 is a standard structure, with the exception of pull-down transistors 40 and 42 and the bitline load control afforded by bus 44 that are provided to perform the desired long write disturb test. It will, of course, be understood that memory 1 according to the preferred embodiment will have a number of memory cells 45 sharing the same bitlines 32, 36 in the same column, each selected by a different wordline 54 and sharing wordline 54 with memory cells 45 in other columns that are in the same row. These other memory cells 45 will, of course, operate similarly as memory cell 45 described herein. Further, in the case of a FIFO device or another type of multiple port memory, each memory cell will have at least one additional wordline to control communication to the second "port". Accordingly, either an entire static memory array, or perhaps just a portion of the memory array may incorporate the present invention and utilize the present invention.

In operation, each of memory cells 45 in memory 1, or in one of array blocks 10 or the portion thereof under test, is first written with a data state according to a known test data pattern. Wordline 54 of memory structure 30 is turned off (preferably, all wordlines 54 in the portion of memory 1 under test are turned off), and bitline true 32 and bitline complement 36 are then both pulled to a logic low level for the duration of a long write cycle (e.g., for a period of on the order of microseconds), responsive to bus 44 being driven to a logic high level which turns on pull-down transistors 40, 42. The driving of both bitline true 32 and bitline complement 36 simultaneously to a logic low level during this long "write" cycle causes memory structure 30 to be disturbed. After the long write test, memory structure 30 is read to determine if memory cell 45 (and others in its column) retained the data state to which it was written prior to the long write test. If the data remains intact, one may conclude that memory structure 30 did not appreciably leak either from bitline true 32 to memory cell node 51 through pass transistor 50, or from bitline complement 36 to memory cell node 53 through pass transistor 52 of memory cell 45 (depending upon the data state to which memory cell 45 was written). The test may then be repeated by writing the opposite data state to memory cell 45 and each of the other cells in the memory, followed by the long write cycle disturb with both of bitline true 32 and bitline complement 36 held low and by rereading of the memory array.

Of course, detectable leakage may occur not only through pass transistors 50, 52, but also as a result of other defects such as transistor isolation or defects between bitlines and internal cell nodes. It is believed, however, that if memory structure 30 does not contain the expected data after the long write disturb cycle, but memory structure 30 was able to pass other test patterns, the data was most likely corrupted by a leakage problem that occurred through pass transistors 50, 52 during the long write test.

A stress test may also be performed during a special test mode by placing an extraordinary voltage, outside of the normal operating specification range, upon wordline 54 while bitline true 32 and bitline complement 36 are both pulled to a logic low level. For example, if memory 1 generally operates with a 5 volt high logic level on wordline 54, this stress test may instead place 9 volts thereupon. This stress test will accelerate any voltage-dependent or time-dependent failure mechanisms for the gate dielectric of pass transistors 50, 52 and thus is useful to screen out devices that would otherwise become infant failures during system use.

Figure 3:
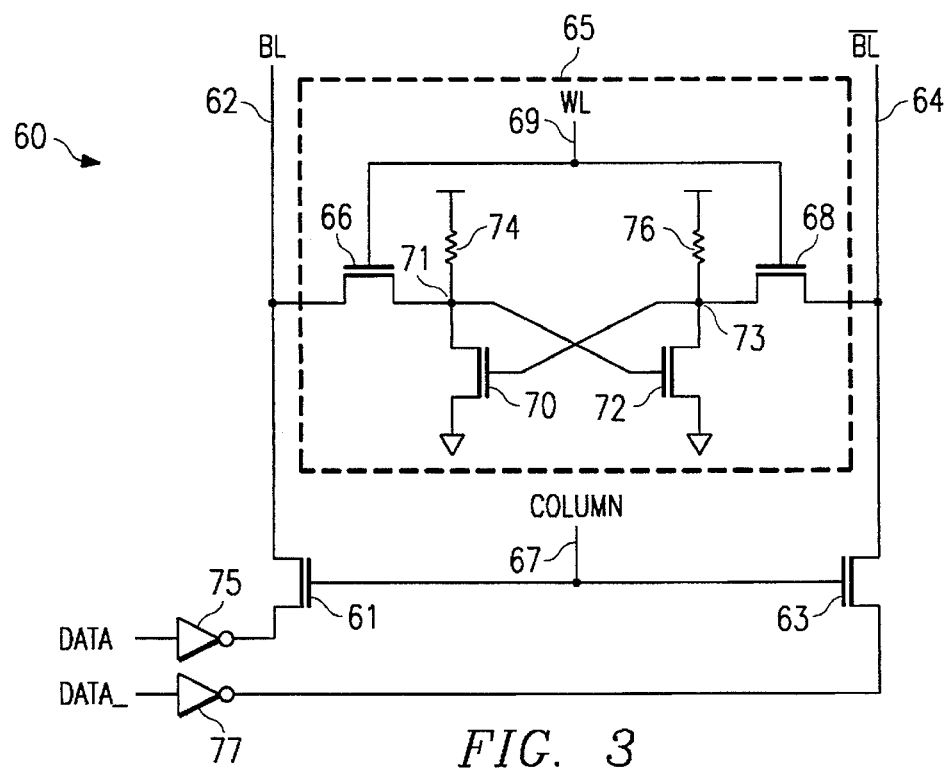
FIG. 3 is an electrical diagram, in schematic form, of a memory structure according to a second preferred embodiment of the present invention.

Referring to FIG. 3, memory structure 60 according to a second preferred embodiment of the present invention, will be described. Memory structure 60, similarly as structure 40 of FIG. 2, also includes 4-T, 2-R memory cell 65 between bitline true 62 and bitline complement 64. Memory cell 65 includes n-channel pass transistor 66 having source/drain path connected on one side to bitline true 62, and n-channel pass transistor 68 having a source/drain path connected on one side to bitline complement 64. The gates of pass transistors 66 and 68 are connected to and controlled by the wordline signal 69. The drains of n-channel cell transistors 70 and 72 are connected to the second side of the source/drain paths of pass transistors 66 and 68, respectively; in cross-coupled fashion, the drain of cell transistor 70 is connected to the gate of cell transistor 72, and vice versa. The sources of cell transistors 70, 72 are biased to ground. Memory cell node 71 is defined at the electrical connection of the drain of cell transistor 70 and the gate of cell transistor 72, and memory cell node 73 is defined at the electrical connection of the drain of cell transistor 72 and the gate of cell transistor 70. Memory cell nodes 71, 73 are pulled up to the memory cell supply voltage $V_{cc}$ through polycrystalline silicon resistors 74 and 76, respectively. While a polysilicon resistor load memory cell 65 is shown in FIG. 3, other types of memory cells, such as a 6 transistor memory cell, may also be used in conjunction with this embodiment of the present invention.

In conjunction with polysilicon resistor load memory cell 65, this embodiment of the present invention also features a bitline true pass transistor 61 and bitline complement pass transistor 63, having source/drain paths connected on one side to bitline true 62 and bitline complement 64, respectively, and whose gates are connected to and controlled by column decode signal 67. The source/drain path of pass transistor 61 is connected on another side to write driver 75 which has line DATA as its input signal, and the source/drain path of pass transistor 63 is connected on another side to write driver 77 which has line DATA$_{13}$ (i.e., complement of DATA) as its input signal.

The column of memory structure 60 is selected upon column decode signal 64 being driven to a logic high level, turning on pass transistors 61 and 63. In normal operation for a write, one of lines DATA, DATA_ is driven high while the other is driven low, according to the data state to be written into the memory cell 65 that has its wordline 69 driven high. In a special test mode according to this embodiment of the invention, however, both line DATA and line DATA_ are driven to a logic high level to present a low logic level on both of bitlines true and complement 62, 64 via write drivers 75 and 77, respectively. This operation of driving both DATA and DATA_ to a logic high level requires overriding the data-in buffer of memory structure 60, which is not shown here. In this way, bitline true 62 and bitline complement 64 are pulled to a logic low level for the duration of the long write disturb by turning on the column select for memory structure 60 (via line 67) and by operation of write drivers 75 and 77. The present invention may also easily be used to turn on multiple columns of a memory structure. For instance, the columns of a full array block 10, or even all array blocks 10 in memory 1, may be turned on according to this embodiment of the present invention. Thus, long write disturb testing according to FIG. 3 also enables column addresses to be overridden to test multiple columns simultaneously.

In operation, after the writing of a test data pattern is written to memory structure 60, the wordline 69 of memory structure 60 is turned off and bitline true 62 and bitline complement 64 are simultaneously pulled to a logic low level for the duration of the long write test (e.g., on the order of microseconds) by setting the column select signal 67 to a logic high level and presenting high logic levels on lines DATA, DATA_, such that write drivers 75 and 77 each present logic low levels to bitlines 62, 64, respectively, of memory structure 60. This condition, where both bitline true 62 and bitline complement 64 are driven simultaneously to a logic low level during the long write test, causes memory structure 60 to be disturbed. After the long write cycle disturb, memory structure 60 is read to determine if memory cell 65 (and the other memory cells under test) retained the data state to which it was written prior to the long write cycle disturb. If the data remains intact, memory structure 60 is not leaking from either bitline 62 to memory cell node 71 through pass transistor 66, or from bitline 64 to memory cell node 73 through pass transistor 68 of memory cell 65. As before, the long write disturb is preferably performed twice, with each memory cell 65 written to both data states, so that both of pass transistors 66, 68 are tested by the long write disturb.

Detectable leakage may occur not only through pass transistors 66, 68, but also because of other defects such as transistor isolation or defects between bitlines and internal cell nodes. However, if memory structure 60 does not contain the expected data yet was able to pass other tests, one may be able to conclude that the data was most likely corrupted by a leakage problem that occurred during the long write disturb cycle.

A stress test may also be performed during a special test mode by placing an extraordinary voltage, outside of the normal operating specification range, upon wordline 69 while bitline true 62 and bitline complement 64 are both pulled to a logic low level. As noted above, an example of the stress test will place 9 volts on wordline 69, in the case where its normal high logic level is nominally 5 volts. This stress test will accelerate any voltage-dependent or time-dependent failure mechanisms for the gate dielectric of pass transistors 66, 68, and thus is useful to screen out devices that would otherwise become infant failures during system use.

The embodiments shown in FIGS. 2 and 3 offer several advantages. Memory structures 40 and 60 allow both the bitline true and bitline complement of a memory cell to be pulled to a logic low level, after the wordline has been turned off, for the duration of the long write disturb cycle, so that the memory cell may be disturbed and then read after testing to determine if it has leakage from the bitlines to the memory cell node. The memory structure 60 of FIG. 3 accomplishes these goals without using the additional pull-down n-channel transistors 40, 42 shown in FIG. 2. Additionally, the memory structure 60 of FIG. 3 offers the advantage of producing small current transient conditions, as switching currents are limited by write drivers 75 and 77 which can service multiple columns.

Figure 4:
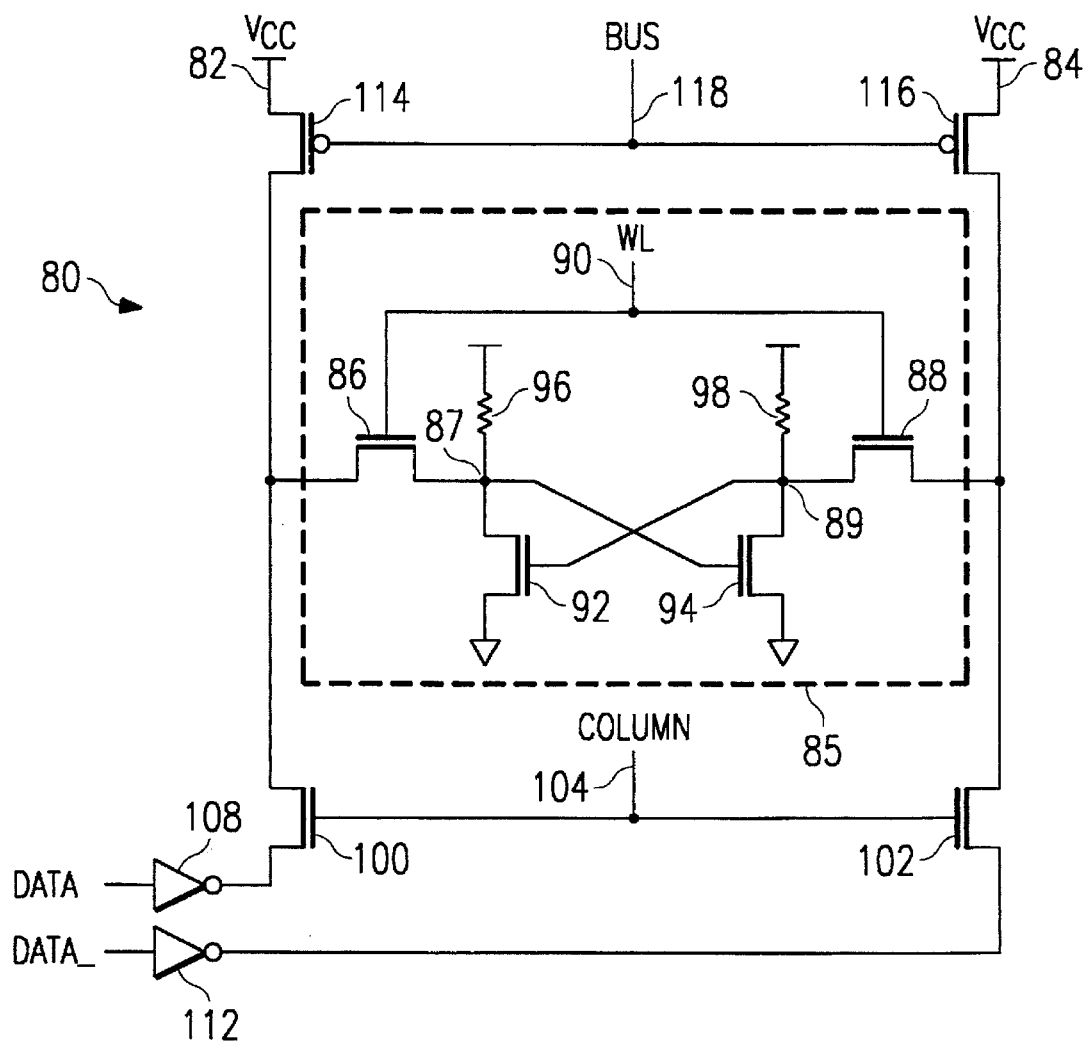
FIG. 4 is an electrical diagram, in schematic form, of a memory structure showing an alternate embodiment to FIG. 3, according to the present invention.

Referring now to FIG. 4, memory structure 80 of FIG. 4 may be used in place of the memory structure of FIG. 3 if it is necessary to turn off bitline loads. Analogous to FIG. 3, memory cell 85 has n-channel pass transistor 86 having a source/drain path connected on one side to bitline true 82, and n-channel pass transistor 88 having a source/drain path connected on one side to bitline complement 84. The gates of pass transistors 86 and 88 are connected to and controlled by the wordline signal 90. The drains of n-channel cell transistors 92, 94 are connected to the other side of pass transistors 86, 88, respectively; the sources of cell transistors 92, 94 are biased to ground. The drain of cell transistor 92 is connected to the gate of cell transistor 94 at memory cell node 87, and the drain of cell transistor 94 is connected to the gate of cell transistor 92 at memory cell node 89; memory cell nodes 87, 89 are pulled up to the memory cell supply voltage V$_{cc}$ through polycrystalline silicon resistors 96 and 98, respectively.

As in FIG. 3, the source/drain path of pass transistor 100 is connected on one end to the output of write driver 108 which has line DATA at its input, and the source/drain path of pass transistor 102 is connected on one end to the output of write driver 112 which has line DATA_ at its input. The column of memory structure 40 is turned on by setting column select signal 104 to a logic high level which turns on both of pass transistors 100, 102, connecting the outputs of write drivers 108, 112 to bitline true 82, bitline complement 84, respectively. Consequently, lines DATA, DATA_ are both driven to a logic high level, by overriding the data-in buffer of memory structure 80, not shown here. In this way, bitline true 82 and bitline complement 84 are pulled to a logic low level for the duration of the long write disturb when the column of memory structure 80 is turned on by column select signal 104, with such driving low accomplished by write drivers 108 and 112.

According to this embodiment of the invention, multiple columns may easily be turned on for the long write disturb. For instance, the columns of an array block 10, or even the entire array of memory 1, may all be turned on, by overriding column address signals in special test mode. The addition of bus 118, which controls the gates of p-channel bitline true load 114 and p-channel bitline complement load 116, respectively, allows the bitline true 82 and bitline complement 84 of memory structure 80 to be pulled to a logic low level with no DC current by turning off bitline loads 114 and 116.

The present invention provides an improved memory structure and a method for performing an efficient and effective long write disturb test on the memory cells of a static memory in order to identify memory cell leakage problems. Using the present invention, all memory cells to be tested may be simultaneously disturbed and then read to determine which, if any, memory cells have leakage problems. Additionally, a minimum amount of control circuitry is needed to accomplish a long write disturb test according to the present invention. Thus, the present invention provides a significant advantage over the prior art in terms of simplified control circuitry and effectiveness of the long write test. This advantage means increased flexibility, effectiveness, and efficiency, as well as reduced layout area and simplified control logic for controlling the wide variety of test data patterns typical of performing long write testing of static memories.

Figure 5:
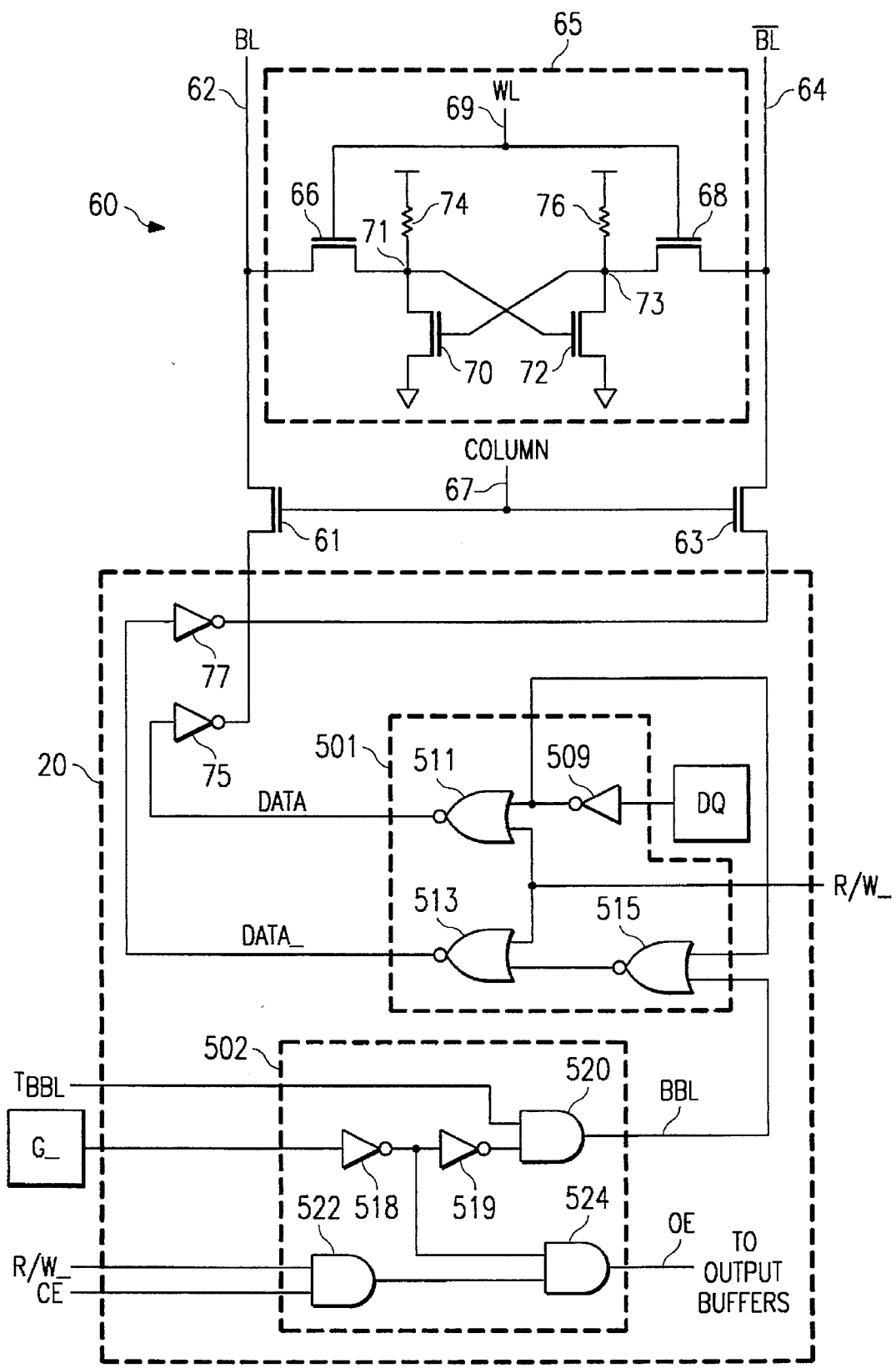
FIG. 5 is an electrical diagram, in schematic form, of a memory structure according to a third preferred embodiment of the present invention, including circuitry for setting the voltage of bitlines for a special test mode.

Referring to FIG. 5, memory structure 60 is shown, using similar reference numerals as discussed hereinabove relative to FIG. 3, but further including buffer 501 for overdriving lines DATA, DATA_ during the special test mode for long write disturb. of course, it is to be understood that buffer 501 may alternatively be used in conjunction with memory structure 80 of FIG. 4, if desired, to drive both bitlines low therein during the long write disturb. In this example, buffer 501 is included within and thus is part of input/output circuitry 20; alternatively, of course, buffer 501 may be provided elsewhere within memory 1.

As noted above, write drivers 75, 77 receive lines DATA, DATA_ at their inputs, respectively. Lines DATA, DATA_ are driven by data input buffer 501, which receives input data at terminal DQ (pad 503) and which, in normal operation, operates in a write mode responsive to a write signal W_ (generated from read/write terminal R/W_ of FIG. 1). Buffer 501 includes NOR gate 511 which drives line DATA at its output; a first input of NOR gate 511 receives the state of input data from terminal DQ (inverted by inverter 509), and a second input of NOR gate 511 receives the write enable signal R/W_ (active low in write mode). Line DATA_ is driven by NOR gate 513 which receives the write signal W_ at one input. The second input of NOR gate 513 is driven by the output of NOR gate 515, which receives an input from terminal DQ via inverter 509 at one input, and which receives both-bitlines-low signal BBL at its other input.

Buffer 501 illustrated in FIG. 5 corresponds to a single data terminal DQ. According to this example, since existing write drivers 75, 77 are used for pulling the bitlines low in the special test mode, the data state of data terminal DQ is that associated with the given column in normal operating mode. As such, buffer 501 is provided for each data terminal DQ, and is therefore placed eight times in the example of by-eight memory 1 of FIG. 1.

As is well known in the art, memories do not normally have a data terminal corresponding to both-bitlines-low signal BBL, as there is no need for such a signal in normal RAM operation. In addition, it is highly desirable to limit the number of external terminals, or pins, of a packaged memory to maximize circuit board component density; as such, it is undesirable to include a special external terminal merely for the both-bitlines-low signal during special test mode, as this pin would not have a function during normal system operation (requiring its bias to a fixed voltage when installed in a circuit board). Therefore, according to this embodiment of the invention, an already-existing terminal that has a function during normal operation is used to select whether or not both-bitlines-low signal BBL is to be asserted during a special test mode. In this example, output enable terminal G_ is preferably used to selectively activate both-bitlines-low signal BBL, since no output data is expected or necessary during a long write disturb cycle or a stress test; furthermore, the other terminals to memory 1 are likely to be in use during such tests.

Referring still to FIG. 5, circuitry 502 is provided for generating both-bitlines-low signal BBL responsive to the state at output enable terminal G_ during special test mode. Circuitry 502 is preferably also located within input/output circuitry 20; in addition, as only a single output enable terminal G_ is provided for memory 1, circuitry 502 may be placed only a single time within memory 1, with its output on line BBL forwarded to each of the placements of buffer 501 for the various data terminals DQ.

Circuitry 502 includes inverting buffer 518 having its input coupled to output enable terminal G_. Buffer 518 is preferably constructed to have the desired trip points for the logic level specifications of memory 1 and, if desired, may be gated by the chip enable signal so as to allow for selective enabling and disabling of the output enable and BBL enabling functions of circuitry 502. The output of inverting buffer 518 is forwarded to a first input of AND gate 524; the second input of AND gate 524 receives the output of AND gate 522, which receives the chip enable signal CE and read/write select signal R/W_ at its inputs. The output of AND gate 524 is output enable signal OE, which is forwarded to output buffers in input/output circuitry 20. As such, in normal operation, when memory 1 is enabled (chip enable signal CE high) and in a read operation (read/write select signal R/W_ high), a low logic level at output enable terminal G_ will produce, via AND gate 524, a high logic level output enable signal OE which enables the output buffers of memory 1. Conversely, if memory 1 is not selected (chip enable signal CE low), if a write operation is selected (read/write select signal R/W_ low) or if output enable terminal G_ has a high level applied thereto, output enable signal OE will remain low and thus will not enable the output buffers in input/output circuitry 20.

The output of inverting buffer 518, which receives output enable terminal G_ at its input, is connected to a first input of AND gate 520 via inverter 519. The second input of AND gate 520 receives test mode enable signal $T_{BBL}$, which is generated by test mode enable circuitry 24 (FIG. 1). Test mode enable signal $T_{BBL}$ may correspond directly to line T (of FIG. 1), or alternatively may be driven to a high logic level only in certain ones of the available test modes for memory 1. In any case, a high logic level on line $T_{BBL}$ indicates the selection of a special test mode in which both bitlines of a differential pair are to be driven low. The output of AND gate 520 drives both-bitlines-low line BBL, which is communicated to an input of NOR gate 515 in circuitry 510, as discussed hereinabove.

During normal operation, line $T_{BBL}$ remains at a low logic level. This forces the output of AND gate 520 low, maintaining both-bitlines-low signal BBL at a low logic level such that the state of data terminal DQ will control the state of lines DATA, DATA_ in a write operation (R/W_ being low), with line DATA high and line DATA_ low when data terminal DQ is high, and line DATA_ high and line DATA low when data terminal DQ is low. Selection of the particular column by column select line 67, and selection of the desired row of memory cells by wordline 69 going high, then effects the write operation. The low logic level on read/write select signal R/W_ forces the output of AND gate 522 low, which in turn forces the output of AND gate 524 low, so that the output buffers are disabled responsive to output enable signal OE being low.

In normal operation for a read operation, read/write select signal R/W_ is high, causing the outputs of both NOR gates 511, 513 to be unconditionally low; this condition will not affect the read operation by sense amplifiers 13 of FIG. 1. The high logic level of signal R/W_ enables output enable terminal G_ to control the generation of the output enable signal OE to the output buffers, as the output of AND gate 522 will be high (assuming memory 1 is selected by chip enable CE being high).

In special test mode for accomplishing the write disturb, line $T_{BBL}$ is driven to a high logic level by test mode enable circuitry 24, thus presenting a high logic level to one input of AND gate 520, and enabling AND gate to respond to the state of output enable terminal G_ to set the state of both-bitlines-low line BBL. Read/write select signal R/W_ is driven low so that NOR gates 511, 513 will set the states of lines DATA, DATA_ responsive to the state of data terminal DQ and both-bitlines low line BBL.

Of course, during this special test mode write operation, the writing of data into memory cells of the memory 1 may be accomplished by placing the desired data state at terminal DQ and maintaining output enable terminal G_ at a low logic level. In this condition, both-bitlines-low line BBL will be low, allowing NOR gate 515 to respond to the state of data terminal DQ to set the complementary states of lines DATA, DATA_ as in the case of a normal write operation. The column is selected by column select line 67, and the desired row is selected by wordline 69 going high, allowing the data to be written to the desired memory cell 65. The low logic level of read/write select signal R/W_ ensures that the output buffers are not turned on, by operation of AND gates 522, 524.

After memory 1 has been written with the test data pattern (whether in special test mode or in normal operation), the write disturb is performed by driving output enable terminal G_ to a high logic level and by placing data terminal DQ at a high logic level. Considering the two inversions by buffer 518 and inverter 519, and since line $T_{BBL}$ is high, AND gate 520 drives a high logic level onto line BBL, forcing the output of NOR gate 515 low despite the low logic level at the output of buffer 509 from data terminal DQ. As a result, both lines DATA, DATA_ are driven high, effecting the write disturb condition as described hereinabove when column select line 67 selects the particular column. This write disturb is maintained for each column or group of columns for the desired disturb duration, for example on the order of microseconds. Following the write disturb condition, those memory cells in memory 1 under test are read, either under a special test mode or in normal operation, to determine whether the data stored therein was changed for any memory cell by the write disturb test. The test is preferably repeated, using the logical complement of the test data pattern written into memory 1 for the first test, thus testing both data states in each memory cell.

As noted above, under the conditions of the long write disturb test, pass transistors 66, 68 may be stressed by placing a stress voltage on wordline 69 while maintaining both bitlines 62, 64 low via the both-bitlines-low signal BBL. As above, the stress voltage is an extraordinary voltage outside of the normal operating specification range. This stress test will accelerate any voltage-dependent or time-dependent failure mechanisms for the gate dielectric of pass transistors 66, 68, and thus is useful to screen out devices that would otherwise become infant failures during system use. Upon stressing of the pass transistors 66, 68 for the desired duration at the desired voltage, memory operation is functionally tested (including, if desired, the write disturb test described hereinabove) to determine if any pass transistors 66, 68 failed during the special stress test.

As in the above embodiments, this embodiment of the invention offers the advantages of driving both the bitline true and bitline complement of a memory cell to a logic low level without using additional pull-down n-channel transistors. In addition, as in the earlier described cases, this operation is performed with only small current transients, as the switching currents are limited by write drivers 168 and 172 which can service multiple columns. Furthermore, according to this embodiment of the invention, separate control of the operation of driving both bitlines low is effected by use of a terminal having a different function during normal operation, in particular the output enable terminal, such that neither an additional external package pin nor an additional bond pad are necessary to allow for the long write disturb and stress tests to be performed in a special test mode. As a result, greater reliability in the manufactured memory population can be achieved in a manner that is highly efficient, from an automated test equipment utilization standpoint.

While the invention has been particularly shown and described with reference to its preferred embodiments, it will be understood by those skilled in the art that various changes in form and detail may be made therein without departing from the spirit and scope of the invention.

I claim:

1. An integrated memory circuit having a normal operating mode and a special test mode, comprising:

a plurality of memory cells, arranged in rows and columns, each column of memory cells associated with a pair of bitlines;

means for selecting one of said plurality of memory cells responsive to an address value received at address terminals;

output circuitry for presenting the contents of the selected one of said plurality of memory cells at an output terminal during a read operation in the normal operating mode;

first and second write drivers, coupled to the pair of bitlines of the column containing the selected one of said plurality of memory cells, for presenting a differential signal on the pair of bitlines corresponding to input data received at an input terminal during a write operation in the normal operating mode;

output enable circuitry, coupled to an output enable terminal and to said output circuitry, for selectively enabling and disabling said output circuitry in the normal operating mode responsive to an output enable signal received at the output enable terminal;

test mode enable circuitry, for causing the memory to enter the special test mode, said test mode enable circuitry presenting a test mode enable signal at an output thereof; and bitline test control circuitry, coupled to said test mode enable circuitry, to the output enable terminal and to the first and second write drivers, for controlling the write drivers to drive both bitlines in a pair of bitlines associated with a column of memory cells to a selected logic level responsive to the bitline test control circuitry receiving the test mode enable signal and to said output enable terminal receiving a signal at a first logic level.

2. The circuit of claim 1, wherein the selected logic level corresponds to ground.

3. The circuit of claim 1, wherein said bitline test control circuitry comprises:

control circuitry, having a first input coupled to the output enable terminal, having a second input coupled to the output of said test mode enable circuitry, and having an output for presenting a bitline test control signal responsive to receiving the test mode enable signal and the first logic level at the output enable terminal; and a data input buffer having a first input coupled to the input terminal, having a second input coupled to the output of said control circuitry, and having outputs coupled to inputs of said first and second write drivers, for presenting a differential signal at its outputs responsive to a logic level received at the input terminal in the absence of the bitline test control signal, and for presenting a common voltage signal at its outputs responsive to receiving the bitline test control signal.

4. The circuit of claim 3, wherein the control circuitry further comprises:

output enable control circuitry, having a first input coupled to the output enable terminal, having a second input coupled to a read/write select terminal, and having an output coupled to the output circuitry, for enabling said output circuitry responsive to the output enable terminal receiving the output enable signal in combination with the read/write select terminal receiving a read select signal, in the normal operating mode.

5. The circuit of claim 3, wherein the data input buffer presents the common voltage signal at its outputs responsive to receiving the bitline test control signal in combination with receiving a first logic level at the input terminal.

6. The circuit of claim 1, further comprising:

bitline loads connected to each bitline of the pair of bitlines associated with each column of memory cells.

7. The circuit of claim 1, wherein each bitline load comprises a transistor having a conduction path connected between one of the bitlines and a power supply voltage, and having a control terminal;

and further comprising:

a bus line coupled to the control terminal of each of the bitline load transistors, for causing the bitline load transistors to be turned off in the special test mode.

8. The circuit of claim 1, wherein each of said memory cells comprises:

first and second cell transistors, each having a conduction path and connected to one another in cross-coupled fashion;

first and second loads, coupled to the conduction path of the first and second cell transistors, respectively, at first and second cell nodes, respectively; and first and second pass transistors, each having a conduction path coupled between one of the bitlines in the associated pair and the first and second cell nodes, respectively, and each having a control terminal coupled to a wordline output from said selecting means.

9. The circuit of claim 1, further comprising:

a plurality of pairs of first and second pass transistors, each first pass transistor having a conduction path coupled between a first bitline associated with a column and said first write driver, each second pass transistor having a conduction path coupled between a second bitline associated with the column and said second write driver, each first and second pass transistor having a control terminal connected in common with one another for receiving a column select signal.

10. The circuit of claim 1, wherein the input terminal and the output terminal are the same terminal.

11. The circuit of claim 1, wherein the plurality of memory cells are arranged into a plurality of array blocks.

12. A method of performing a special test operation on an integrated memory circuit, comprising:

writing a known data pattern into a plurality of memory cells in the integrated memory circuit;

entering a special test mode;

selecting a column of the plurality of memory cells in the circuit, the column of memory cells being associated with first and second differential bitlines, and each memory cell in the selected column having first and second pass transistors having conduction paths connected between first and second memory cell nodes and first and second bitlines, respectively, and having a control terminal controlled by a wordline;

for the selected column and after said step of entering the special test mode, driving both of said first and second bitlines to a selected voltage for a selected time responsive to receiving an input signal at a circuit terminal, wherein in a normal operating mode the circuit terminal selectively enables and disables output circuitry of the memory circuit; and after said driving step, reading the contents of the plurality of memory cells.

13. The method of claim 12, wherein the circuit terminal is an output enable terminal, for selectively enabling and disabling output circuitry of the memory circuit.

14. The method of claim 12, further comprising:

after said writing step, driving the wordline with a signal to turn off the first and second pass transistors of a memory cell in the selected column.

15. The method of claim 12, further comprising:

during said step of driving both of said first and second bitlines to a selected voltage, placing a stress voltage onto a wordline for a selected time.

16. The method of claim 12, wherein said step of driving both of said first and second bitlines to a selected voltage for a selected time comprises:

performing a logical combination of a signal presented to an output enable terminal of the memory circuit with a signal presented to an input data terminal of the memory circuit.

17. The method of claim 12, wherein the selected voltage is ground.

18. An integrated memory circuit having a normal operating mode and a special test mode, comprising:

a plurality of memory cells, arranged in rows and columns, each column of memory cells associated with a pair of bitlines;

means for selecting one of said plurality of memory cells responsive to an address value received at address terminals;

output circuitry for presenting the contents of the selected one of said plurality of memory cells at an output terminal during a read operation in the normal operating mode;

first and second write drivers, coupled to the pair of bitlines of the column containing the selected one of said plurality of memory cells, for presenting a differential signal on the pair of bitlines corresponding to input data received at an input terminal during a write operation in the normal operating mode;

a function terminal having a specified function in normal operating mode;

test mode enable circuitry, for causing the memory to enter the special test mode, said test mode enable circuitry presenting a test mode enable signal at an output thereof; and bitline test control circuitry, coupled to said test mode enable circuitry, to the function terminal and to the first and second write drivers, for controlling the write drivers to drive both of the bitlines of a column of memory cells to a selected logic level responsive to the bitline test control circuitry receiving the test mode enable signal and to said function terminal receiving a signal at a first logic level.

19. The circuit of claim 18, further comprising:

output enable circuitry, coupled to an output enable terminal and to said output circuitry, for selectively enabling and disabling said output circuitry in the normal operating mode responsive to an output enable signal received at the output enable terminal;

and wherein said function terminal is the output enable terminal.

20. The circuit of claim 18, wherein said bitline test control circuitry comprises:

control circuitry, having a first input coupled to the function terminal, having a second input coupled to the output of said test mode enable circuitry, and having an output for presenting a bitline test control signal responsive to receiving the test mode enable signal and the first logic level at the function terminal; and a data input buffer having a first input coupled to the input terminal, having a second input coupled to the output of said control circuitry, and having outputs coupled to inputs of said first and second write drivers, for presenting a differential signal at its outputs responsive to a logic level received at the input terminal in the absence of the bitline test control signal, and for presenting a common voltage signal at its outputs responsive to receiving the bitline test control signal.

21. The circuit of claim 20, wherein the data input buffer presents the common voltage signal at its outputs responsive to receiving the bitline test control signal in combination with receiving a first logic level at the input terminal.

22. The circuit of claim 18, wherein the selected logic level corresponds to ground.

* * * * *